US012164236B2

(12) United States Patent
Ueda

(10) Patent No.: US 12,164,236 B2
(45) Date of Patent: Dec. 10, 2024

(54) MEASUREMENT DEVICE AND MEASUREMENT METHOD, EXPOSURE APPARATUS AND EXPOSURE METHOD, AND DEVICE MANUFACTURING METHOD

(71) Applicant: NIKON CORPORATION, Tokyo (JP)

(72) Inventor: Akihiro Ueda, Sakai (JP)

(73) Assignee: NIKON CORPORATION, Tokyo (JP)

( * ) Notice: Subject to any disclaimer, the term of this patent is extended or adjusted under 35 U.S.C. 154(b) by 243 days.

(21) Appl. No.: 17/837,107

(22) Filed: Jun. 10, 2022

(65) Prior Publication Data

US 2022/0317581 A1     Oct. 6, 2022

Related U.S. Application Data

(63) Continuation of application No. 16/836,016, filed on Mar. 31, 2020, now abandoned, which is a
(Continued)

(30) Foreign Application Priority Data

Dec. 24, 2014 (JP) ................................. 2014-259759

(51) Int. Cl.
*G03F 9/00*     (2006.01)
*G01B 11/00*     (2006.01)
(Continued)

(52) U.S. Cl.
CPC ............ *G03F 9/7003* (2013.01); *G01B 11/00* (2013.01); *G01B 11/14* (2013.01); *G01D 5/38* (2013.01); *G03F 7/20* (2013.01); *G03F 9/00* (2013.01)

(58) Field of Classification Search
CPC .... G03F 9/7003; G03F 9/7088; G03F 9/7084; G03F 9/7015; G03F 9/7069;
(Continued)

(56) References Cited

U.S. PATENT DOCUMENTS 4,780,617 A    10/1988    Umatate et al.
5,166,754 A    11/1992    Suzuki et al.
(Continued)

FOREIGN PATENT DOCUMENTS

JP    H05-180667 A    7/1993
JP    2001-250766 A    9/2001
(Continued)

OTHER PUBLICATIONS

Apr. 5, 2016 Search Report issued in International Patent Application No. PCT/JP2015/085848.
(Continued)

*Primary Examiner* — Hoa Q Pham
(74) *Attorney, Agent, or Firm* — Oliff PLC

(57) ABSTRACT

A measurement system in which an object that moves toward a processing position serves as a measurement target. In the processing position a processing device is capable of applying processing to the object. The measurement system includes: a mark detection device that has an irradiation system to irradiate a mark provided at the object that is moving with a measurement beam while moving the measurement beam; and a beam receiving system to receive a beam from the mark. The irradiation system irradiates the object with the measurement beam while moving the measurement beam, during a period when the object moves toward the processing position.

12 Claims, 10 Drawing Sheets

Related U.S. Application Data continuation of application No. 16/428,223, filed on May 31, 2019, now Pat. No. 10,642,169, which is a continuation of application No. 15/627,707, filed on Jun. 20, 2017, now Pat. No. 10,372,046, which is a continuation of application No. PCT/JP2015/085848, filed on Dec. 22, 2015.

(51) Int. Cl.
  *G01B 11/14* (2006.01)
  *G01D 5/38* (2006.01)
  *G03F 7/20* (2006.01)

(58) Field of Classification Search
  CPC ....... G03F 7/70258; G03F 9/00; G01B 11/14; G01B 11/27; G01B 11/26; G01B 11/00; G01D 5/38
  USPC ............. 356/399–401, 614–623; 355/53–77; 430/5, 22
  See application file for complete search history.

(56) References Cited

U.S. PATENT DOCUMENTS

| | | | |
|---|---|---|---|
| 5,404,220 | A | 4/1995 | Takeuchi et al. |
| 5,436,724 | A | 7/1995 | Ishizuka et al. |
| 5,448,332 | A | 9/1995 | Sakakibara et al. |
| 5,489,986 | A | 2/1996 | Magome et al. |
| 5,528,027 | A | 6/1996 | Mizutani |
| 5,646,413 | A | 7/1997 | Nishi |
| 5,682,243 | A * | 10/1997 | Nishi .................. G03F 7/70425 356/401 |
| 5,801,389 | A | 9/1998 | Mizutani et al. |
| 6,153,886 | A | 11/2000 | Hagiwara et al. |
| 6,266,130 | B1 | 7/2001 | Hasegawa et al. |
| 6,611,316 | B2 | 8/2003 | Sewell |
| 6,778,257 | B2 | 8/2004 | Bleeker et al. |
| 7,023,610 | B2 | 4/2006 | Ohtsuki et al. |
| 8,004,650 | B2 | 8/2011 | Hirukawa |
| 8,054,472 | B2 | 11/2011 | Shibazaki |
| 8,411,271 | B2 | 4/2013 | Shibazaki |
| 8,593,646 | B2 | 11/2013 | Den Boef et al. |
| 9,030,661 | B1 | 5/2015 | Mieher et al. |
| 10,036,968 | B2 | 7/2018 | Ueda |
| 10,365,568 | B2 | 7/2019 | Ueda |
| 10,372,046 | B2 | 8/2019 | Ueda |
| 2002/0041377 | A1 | 4/2002 | Hagiwara et al. |
| 2003/0025890 | A1 | 2/2003 | Nishinaga |
| 2007/0263191 | A1 | 11/2007 | Shibazaki |
| 2010/0066992 | A1 | 3/2010 | Ono |
| 2011/0053061 | A1 | 3/2011 | Shibazaki |
| 2012/0212718 | A1 | 8/2012 | Den Boef |
| 2012/0212749 | A1 | 8/2012 | Den Boef et al. |
| 2013/0230798 | A1 | 9/2013 | Maeda |
| 2017/0351188 | A1 * | 12/2017 | Ueda ..................... G03F 9/7084 |
| 2018/0329307 | A1 | 11/2018 | Brinkhof et al. |

FOREIGN PATENT DOCUMENTS

| | | |
|---|---|---|
| JP | 2002083760 A | 3/2002 |
| JP | 2012-175103 A | 9/2012 |
| KR | 10-2012-0095316 A | 8/2012 |
| WO | 01/035168 A1 | 5/2001 |

OTHER PUBLICATIONS

Jun. 27, 2017 International Preliminary Report on Patentability issued in International Patent Application No. PCT/JP2015/085848.
Apr. 4, 2018 Office Action issued in Japanese Patent Application No. 2016-566390.
May 2, 2018 Office Action issued in Chinese Patent Application No. 201580076880.3.
Aug. 17, 2018 Extended Search Report issued in European Patent Application No. 15873079.6.
Sep. 12, 2018 Office Action issued in U.S. Appl. No. 15/627,707.
Dec. 14, 2018 Office Action issued in Korean Patent Application No. 10-2017-7020375.
Apr. 18, 2019 Office Action issued in Chinese Patent Application No. 201580076880.3.
Feb. 27, 2019 Notice of Allowance and Fee(s) Due issued in U.S. Appl. No. 15/627,707.
Mar. 11, 2019 Notice of Allowance and Fee(s) Due issued in U.S. Appl. No. 15/627,707.
May 31, 2019 Notice of Allowance and Fee(s) Due issued in U.S. Appl. No. 15/627,707.
May 10, 2019 Office Action issued in Taiwanese Patent Application No. 104143485.
Sep. 6, 2019 Office Action Issued in U.S. Appl. No. 16/428,223.
Feb. 28, 2020 Office Action issued in European Patent Application No. 15 873 079.6.
Dec. 27, 2019 Notice of Allowance and Fee(s) Due issued in U.S. Appl. No. 16/428,223.
Apr. 6, 2020 Notice of Allowance and Fee(s) Due issued in U.S. Appl. No. 16/428,223.
Sep. 24, 2021 Office Action issued in U.S. Appl. No. 16/836,016.
Nov. 19, 2021 Office Action issued in European Patent Application No. 21 17 7718.0.
Feb. 28, 2022 Office Action issued in U.S. Appl. No. 16/836,016.

* cited by examiner

MEASUREMENT DEVICE AND MEASUREMENT METHOD, EXPOSURE APPARATUS AND EXPOSURE METHOD, AND DEVICE MANUFACTURING METHOD

CROSS-REFERENCE TO RELATED APPLICATIONS

This is a continuation of U.S. patent application Ser. No. 16/836,016 filed Mar. 31, 2020 (now abandoned), which in turn is a continuation of U.S. patent application Ser. No. 16/428,223 filed May 31, 2019 (now U.S. Pat. No. 10,642, 169), which is a continuation of U.S. patent application Ser. No. 15/627,707 filed on Jun. 20, 2017 (now U.S. Pat. No. 10,372,046), which is a continuation of International Patent Application No. PCT/JP2015/085848, with an international filing date of Dec. 22, 2015, claiming priority from Japanese Patent Application No. 2014-259759 filed Dec. 24, 2014. The disclosure of each of the above-identified applications is incorporated herein by reference in their entirety.

BACKGROUND OF THE INVENTION

Field of the Invention

The present invention relates to measurement devices and measurement methods, exposure apparatuses and exposure methods, and device manufacturing methods, and more particularly to a measurement device and a measurement method to obtain positional information of grating marks provided at an object, an exposure apparatus equipped with the measurement device and an exposure method using the measurement method, and a device manufacturing method using the exposure apparatus or the exposure method.

Description of the Background Art

Conventionally, in a lithography process for manufacturing electronic devices (micro devices) such as semiconductor devices (integrated circuits and the like), and liquid crystal display devices, a projection exposure apparatus of a step-and-scan method (a so-called scanning stepper (which is also called a scanner)) and the like are used.

In this type of exposure apparatuses, for example, since plural layers of patterns are formed and overlaid on a wafer or a glass plate (hereinafter, generically referred to as a "wafer"), an operation (a so-called alignment) for optimizing a relative positional relationship between a pattern already formed on the wafer and a pattern that a mask or a reticle (hereinafter, generically referred to as a "reticle") has is performed. Further, as an alignment system (sensor) used in this type of alignment, the one that performs detection of a grating mark provided on the wafer by scanning a measurement beam with respect to the grating mark (causing the measurement beam to follow the grating mark) is known (e.g., refer to U.S. Pat. No. 8,593,646).

In this type of alignment systems, however, since the measurement beam is scanned, an objective optical system including an objective lens is required to have a wide field of view. However, in the case of simply widening the field of view of the objective lens, the objective optical system including the objective lens increases in size.

SUMMARY OF THE INVENTION

According to a first aspect, there is provided a measurement device, comprising: a mark detection system that has an irradiation system, an objective optical system and a beam receiving system, the irradiation system irradiating a grating mark provided at an object that is moved in a first direction, with a measurement beam, while scanning the measurement beam in the first direction with respect to the grating mark, the objective optical system including an objective optical element capable of facing the object that is moved in the first direction, and the beam receiving system receiving a diffraction beam from the grating mark of the measurement beam via the objective optical system; and a calculation system that obtains positional information of the grating mark on the basis of a detection result of the mark detection system, wherein the objective optical element deflects or diffracts the diffraction beam generated at the grating mark toward the beam receiving system.

According to a second aspect, there is provided an exposure apparatus, comprising: the measurement device related to the first aspect; a position control device that controls a position of the object on the basis of an output of the measurement device; and a pattern formation device that forms a predetermined pattern on the object by irradiating the object with an energy beam.

According to a third aspect, there is provided an exposure apparatus, comprising: the measurement device related to the first aspect, wherein a predetermined pattern is formed on the object by irradiating the object with an energy beam, while controlling a position of the object on the basis of an output of the measurement device.

According to a fourth aspect, there is provided an exposure apparatus that forms a predetermined pattern on an object by irradiating the object with an energy beam, the apparatus comprising: a mark detection system that has an irradiation system, an objective optical system and a beam receiving system, the irradiation system irradiating a grating mark provided at the object that is moved in a first direction, with a measurement beam, while scanning the measurement beam in the first direction with respect to the grating mark, the objective optical system including an objective optical element capable of facing the object that is moved in the first direction, and the beam receiving system receiving a diffraction beam from the grating mark of the measurement beam via the objective optical system, wherein the diffraction beam generated at the grating mark is deflected or diffracted, by the objective optical system, toward the beam receiving system, and a position of the object is controlled on the basis of a detection result of the mark detection system.

According to a fifth aspect, there is provided a device manufacturing method, comprising: exposing a substrate using the exposure apparatus related to any one of the second aspect to the fourth aspect; and developing the substrate that has been exposed.

According to a sixth aspect, there is provided a measurement method of measuring positional information of a grating mark provided at an object, the method comprising: moving the object in a first direction, below an objective optical system including an objective optical element capable of facing the object; irradiating the grating mark of the object that is moved, with a measurement beam, while scanning the measurement beam in the first direction with respect to the grating mark; receiving a diffraction beam from the grating mark of the measurement beam with a beam receiving system via the objective optical system; and obtaining positional information of the grating mark on the basis of an output of the beam receiving system, wherein the objective optical system deflects or diffracts the diffraction beam generated at the grating mark, toward the beam receiving system.

According to a seventh aspect, there is provided an exposure method, comprising: measuring positional information of a grating mark provided at an object using the measurement method related to the sixth aspect; and exposing the object with an energy beam, while controlling a position of the object on the basis of the positional information of the grating mark that has been measured.

According to an eighth aspect, there is provided a device manufacturing method, comprising: exposing a substrate using the exposure method related to the seventh aspect; and developing the substrate that has been exposed.

BRIEF DESCRIPTION OF DRAWINGS

In the accompanying drawings;

FIG. 7b is a view showing diffraction beams incident on the objective transparent plate in FIG. 7a;

FIG. 8b is a plan view of an objective transparent plate used to detect the grating mark in FIG. 8a;

DESCRIPTION OF EMBODIMENTS

First Embodiment

A first embodiment will be discussed below, on the basis of FIGS. 1 to 6.

Figure 1:
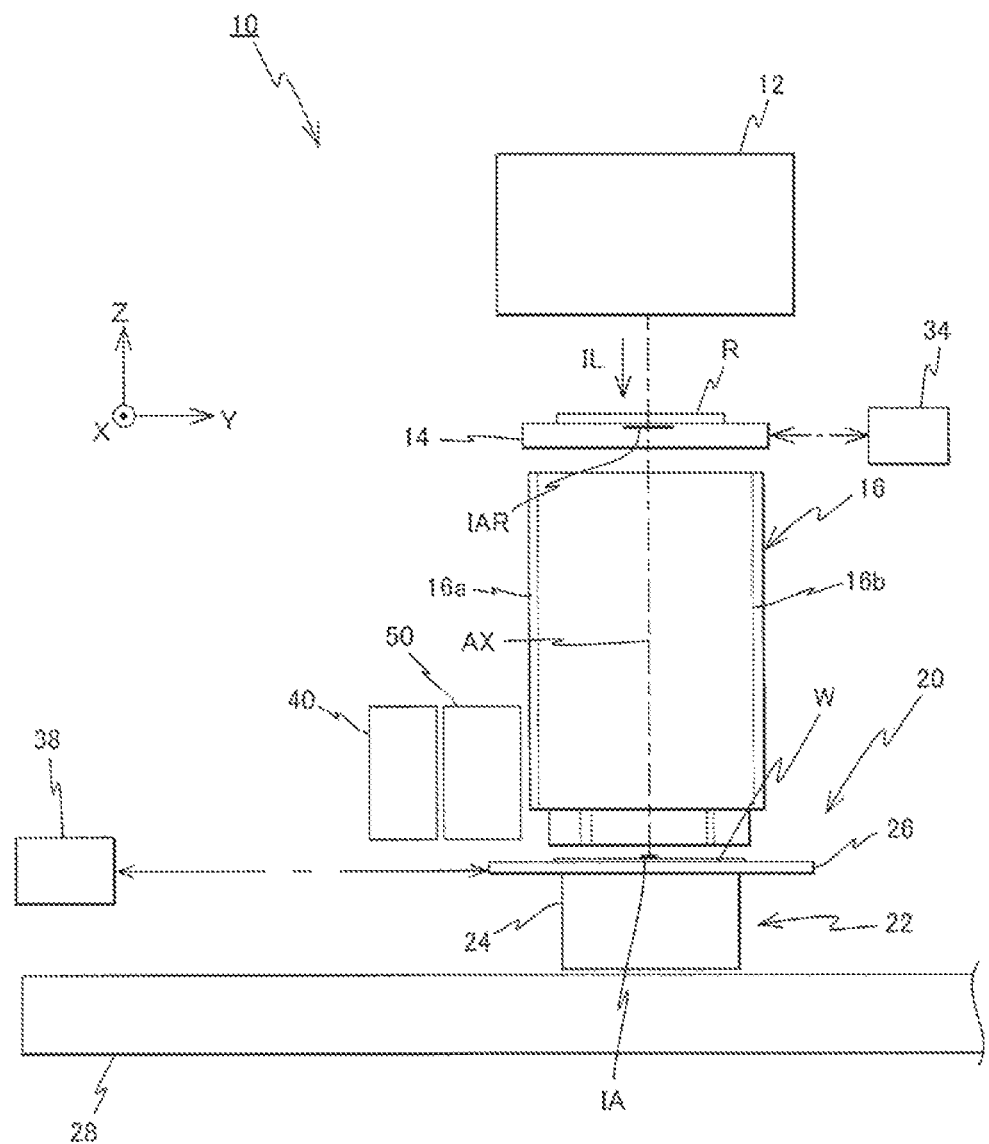
FIG. 1 is a view schematically showing a configuration of an exposure apparatus related a first embodiment.

FIG. 1 schematically shows a configuration of an exposure apparatus 10 related to the first embodiment. Exposure apparatus 10 is a projection exposure apparatus of a step-and-scan method, which is a so-called scanner. As will be described later, in the present embodiment, a projection optical system 16b is provided, and in the description below, the explanation is given assuming that a direction parallel to an optical axis AX of projection optical system 16b is a Z-axis direction, a direction in which a reticle R and a wafer W are relatively scanned within a plane orthogonal to the Z-axis direction is a Y-axis direction, a direction orthogonal to the Z-axis and the Y-axis is an X-axis direction, and rotation (tilt) directions around the X-axis, the Y-axis and the Z-axis are θx, θy and θz directions, respectively.

Exposure apparatus 10 is equipped with: an illumination system 12; a reticle stage 14; a projection unit 16; a wafer stage device 20 including a wafer stage 22; a multipoint focal position measurement system 40; an alignment system 50; a control system thereof; and the like. In FIG. 1, wafer W is placed on wafer stage 22.

As is disclosed in, for example, U.S. Patent Application Publication No. 2003/0025890 and the like, illumination system 12 includes: a light source; and an illumination optical system that has an illuminance uniformizing optical system having an optical integrator, and a reticle blind (none of which is illustrated). Illumination system 12 illuminates an illumination area IAR having a slit-like shape elongated in the X-axis direction on reticle R set (restricted) by the reticle blind (a masking system) with illumination light (exposure light) IL with almost uniform illuminance. As illumination light IL, for example, an ArF excimer laser beam (with a wavelength of 193 nm) is used.

On reticle stage 14, reticle R having a pattern surface (a lower surface in FIG. 1) on which a circuit pattern and the like are formed is fixed by, for example, vacuum adsorption. Reticle stage 14 is finely drivable within an XY plane and also drivable at a predetermined scanning velocity in a scanning direction (the Y-axis direction that is a lateral direction on the page surface of FIG. 1), with a reticle stage drive system 32 (not illustrated in FIG. 1, see FIG. 6) including, for example, a linear motor and the like. Positional information within the XY plane (including rotation information in the θz direction) of reticle stage 14 is constantly measured at a resolution of, for example, around 0.5 to 1 nm with a reticle stage position measurement system 34 including, for example, an interferometer system (or an encoder system). The measurement values of reticle stage position measurement system 34 are sent to a main controller 30 (not illustrated in FIG. 1, see FIG. 6). Main controller 30 controls the position (and the velocity) of reticle stage 14 by calculating the position of reticle stage 14 in the X-axis direction, the Y-axis direction and the θz direction on the basis of the measurement values of reticle stage position measurement system 34 and controlling reticle stage drive system 32 on the basis of this calculation result. Further, exposure apparatus 10 is equipped with a reticle alignment system 18 (see FIG. 6) for performing position detection of reticle alignment marks formed on reticle R, though the reticle alignment system is not illustrated in FIG. 1. As reticle alignment system 18, an alignment system having a configuration as disclosed in, for example, U.S. Pat. No. 5,646,413, U. S. Patent Application Publication No. 2002/0041377 and the like can be used.

Projection unit 16 is disposed below reticle stage 14 in FIG. 1. Projection unit 16 includes a lens barrel 16a and projection optical system 16b stored within lens barrel 16a. As projection optical system 16b, for example, a dioptric system composed of a plurality of optical elements (lens elements) arrayed along optical axis AX parallel to the Z-axis direction is used. Projection optical system 16b is, for example, both-side telecentric, and has a predetermined projection magnification (such as ¼ times, ⅕ times or ⅛ times). Therefore, when illumination area IAR on reticle R is illuminated with illumination system 12, by illumination light IL, which has passed through reticle R whose pattern surface is disposed almost coincident with a first plane (an object plane) of projection optical system 16b, a reduced image of a circuit pattern (a reduced image of a part of the circuit pattern) of reticle R within illumination area IAR is formed via projection optical system 16b (projection unit 16) onto an area (hereinafter, also referred to as an exposure area) IA, conjugate with illumination area IAR described above, on wafer W whose surface is coated with resist (sensitive agent) and which is disposed on a second plane (an image plane) side of projection optical system 16b. Then, by synchronous driving of reticle stage 14 and wafer stage 22, reticle R is moved in the scanning direction (the Y-axis direction) relative to illumination area IAR (illumination light IL) and also wafer W is moved in the scanning direction (the Y-axis direction) relative to exposure area IA (illumination light IL), and thereby the scanning exposure of one shot area (a divided area) on wafer W is performed and the pattern of reticle R is transferred onto the shot area. That is, in the present embodiment, a pattern is generated on wafer W by illumination system 12, reticle R and projection optical system 16b, and the pattern is formed on wafer W by exposure of a sensitive layer (a resist layer) on wafer W with illumination light IL.

Wafer stage device 20 is equipped with wafer stage 22 disposed above a base board 28. Wafer stage 22 includes a stage main body 24, and a wafer table 26 mounted on stage main body 24. Stage main body 24 is supported on base board 28, via a clearance (an interspace, or a gap) of around several μm, by noncontact bearings (not illustrated), e.g., air bearings, fixed to the bottom surface of stage main body 24. Stage main body 24 is configured drivable relative to base board 28 in directions of three degrees of freedom (X, Y, θz) within a horizontal plane, by a wafer stage drive system 36 (not illustrated in FIG. 1, see FIG. 6) including, for example, a linear motor (or a planar motor). Wafer stage drive system 36 includes a fine drive system that finely drives wafer table 26 relative to stage main body 24 in directions of six degrees of freedom (X, Y, Z, θx, θy and θz). Positional information of wafer table 26 in the directions of six degrees of freedom is constantly measured at a resolution of, for example, around 0.5 to 1 nm with a wafer stage position measurement system 38 including, for example, an interferometer system (or an encoder system). The measurement values of wafer stage position measurement system 38 are sent to main controller 30 (not illustrated in FIG. 1, see FIG. 6). Main controller 30 controls the position (and the velocity) of wafer table 26 by calculating the position of wafer table 26 in the directions of six degrees of freedom on the basis of the measurement values of wafer stage position measurement system 38 and controlling wafer stage drive system 36 on the basis of this calculation result. Main controller 30 also controls the position of stage main body 24 within the XY plane on the basis of the measurement values of wafer stage position measurement system 38.

Multipoint focal position measurement system 40 is a position measurement device of an oblique incidence method that measures positional information of wafer W in the Z-axis direction, which has a configuration similar to the one disclosed in, for example, U.S. Pat. No. 5,448,332 and the like. As illustrated in FIG. 1, multipoint focal position measurement system 40 is disposed on the further −Y side of alignment system 50 disposed on the −Y side of projection unit 16. Since the output of multipoint focal position measurement system 40 is used for autofocus control that will be described later, multipoint focal position measurement system 40 is referred to as an AF system 40 hereinafter.

AF system 40 is equipped with: an irradiation system that irradiates the wafer W surface with a plurality of detection beams; and a beam receiving system that receives reflection beams, from the wafer W surface, of the plurality of detection beams (none of these systems is illustrated). A plurality of detection points of AF system 40 (irradiation points of the detection beams) are disposed at a predetermined interval along the X-axis direction on a surface to be detected, though the illustration of the detection points is omitted. In the present embodiment, for example, the detection points are disposed in a matrix shape having one row and M columns (M is a total number of the detection points) or 2 rows and N columns (N is a half of the total number of the detection points). The output of the beam receiving system is supplied to main controller 30 (see FIG. 6). Main controller 30 obtains positional information in the Z-axis direction of the wafer W surface (surface position information) at the plurality of detection points on the basis of the output of the beam receiving system. In the present embodiment, the length in the X-axis direction of a detection area of the surface position information by AF system 40 (a disposed area of the plurality of detection points) is set equal to at least the length in the X-axis direction of one shot area set on wafer W.

Prior to an exposure operation, main controller 30 moves wafer W relative to the detection area of AF system 40 in the Y-axis direction and/or the X-axis direction as needed, and acquires the surface position information of wafer W on the basis of the output of AF system 40 at that time. Main controller 30 performs the acquisition of the surface position information as described above for all the shot areas set on wafer W, and associates the results of the acquisition with the positional information of wafer table 26 to store them as focus mapping information.

Next, alignment marks formed on wafer W and alignment system 50 of an off-axis type used in detection of the alignment marks will be described.

Figure 2A:
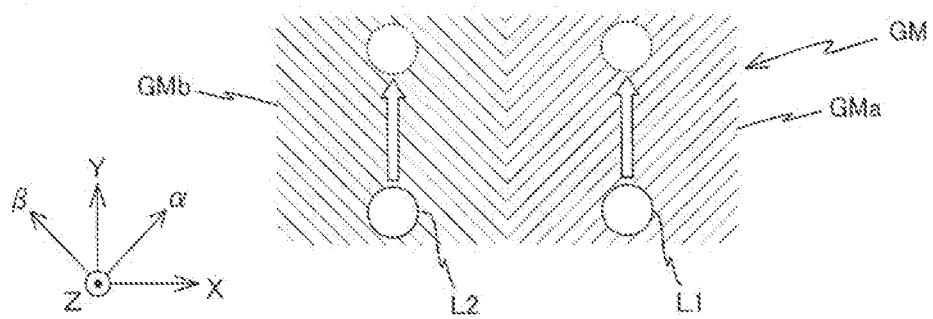
FIG. 2a to FIG. 2c are views showing examples (No. 1 to No. 3) of grating marks formed on a wafer.

As a detection subject by alignment system 50, at least one grating mark GM as illustrated in FIG. 2a is formed in each shot area on wafer W. Note that actually grating mark GM is formed in a scribe line of each shot area.

Grating mark GM includes a first grating mark GMa and a second grating mark GMb. The first grating mark GMa is made up of a reflection-type diffraction grating in which grating lines extending in a direction (hereinafter, referred to as an α direction for the sake of convenience) that is at a 45 degree angle with respect to the X-axis within the XY plane are formed at a predetermined interval (e.g., a pitch P1 (P1 is an arbitrary numerical value)) in a direction (hereinafter, referred to as a β direction for the sake of convenience) orthogonal to the α direction within the XY plane, and which has a period direction in the β direction. The second grating mark GMb is made up of a reflection-type diffraction grating in which grating lines extending in the β direction are formed at a predetermined interval (e.g., a pitch P2 (P2 is an arbitrary numerical value)) in the α direction, and which has a period direction in the α direction. The first grating mark GMa and the second grating mark GMb are disposed consecutively (adjacently) in the X-axis direction so that the positions of the first grating mark GMa and the second grating mark GMb in the Y-axis direction are the same. Note that, in FIG. 2a, the pitch of the grating is illustrated considerably wider than the actual pitch for the sake of convenience for illustration. The same is true for diffraction gratings as illustrated in the other drawings. Incidentally, pitch P1 and pitch P2 may be the same numerical value or may be the numerical values different from each other. Further, although the first grating mark GMa and the second grating mark GMb are in contact with each other in FIG. 2, they need not be in contact with each other.

Figure 3:
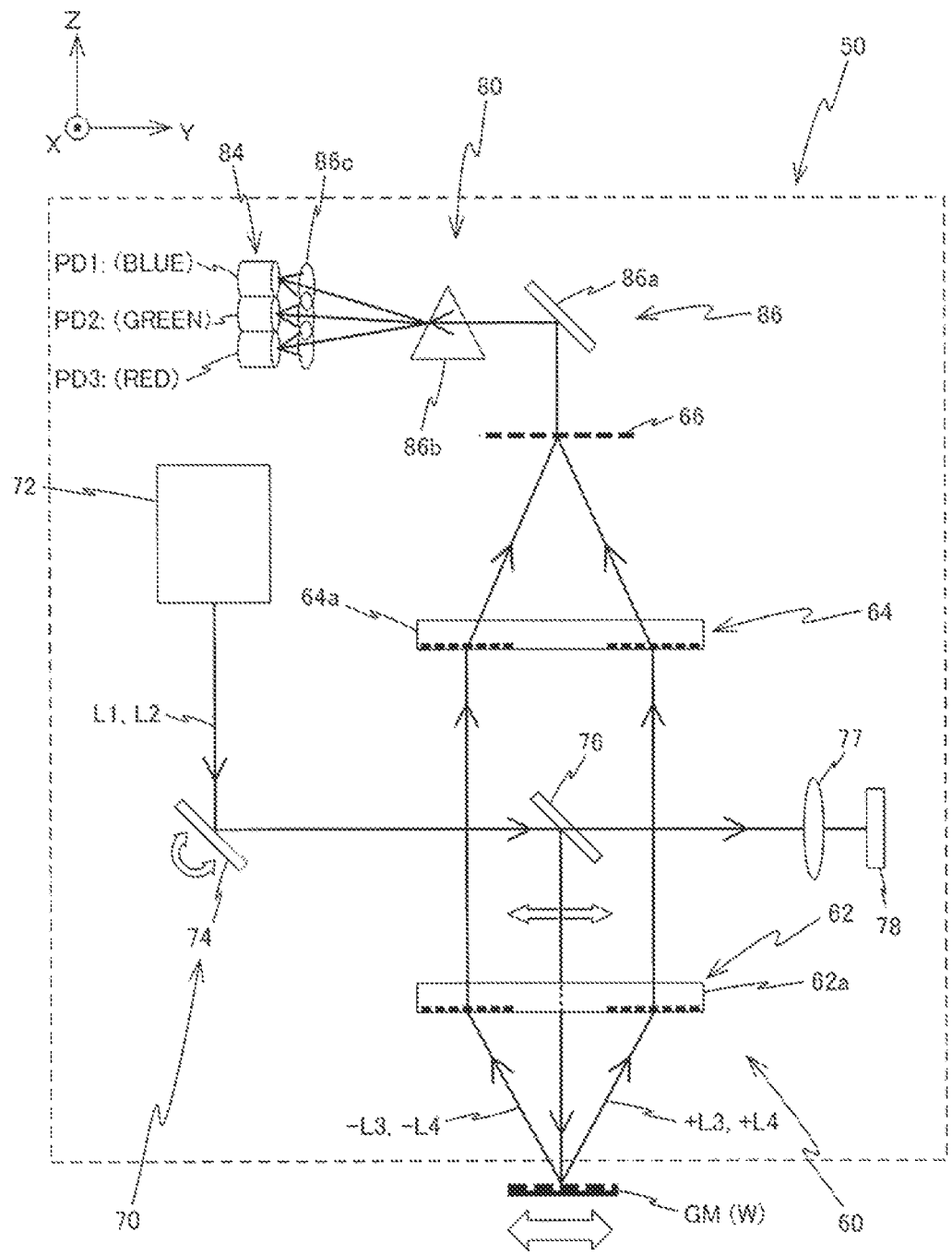
FIG. 3 is a view showing a configuration of an alignment system that the exposure apparatus in FIG. 1 has.

As illustrated in FIG. 3, alignment system 50 is equipped with: a light source 72 that emits a plurality of measurement beams L1 and L2; an objective optical system 60 that includes an objective transparent plate (which is also referred to as an objective optical element) 62 disposed facing wafer W; an irradiation system 70 that irradiates grating mark GM on wafer W with measurement beams L1 and L2 via objective transparent plate 62 while scanning the measurement beams L1 and L2 in the scanning direction (which is the Y-axis direction in the present embodiment and is also referred to as "a first direction" as needed); and a beam receiving system 80 that receives, via objective optical system 60, diffraction beams ±L3 and ±L4 from grating mark GM based measurement beams L1 and L2.

Irradiation system 70 is equipped with: light source 72 described above; a movable mirror 74 disposed on optical paths of measurement beams L1 and L2; a half mirror (a beam splitter) 76 that reflects parts of measurement beams L1 and L2 reflected by movable mirror 74 toward wafer W and transmits the rest of the measurement beams; a beam position detection sensor 78 disposed on optical paths of measurement beams L1 and L2 transmitted (having passed) through half mirror 76; and the like.

Light source 72 emits two measurement beams L1 and L2 having a broadband wavelength, to which the resist coated on wafer W (see FIG. 1) is insensitive, in the −Z direction. Note that, in FIG. 3, the optical path of measurement beam L2 overlaps with the optical path of measurement beam L1, on the depth side of the paper surface. In the present first embodiment, as measurement beams L1 and L2, for example, white light is used.

As movable mirror 74, for example, the well-known galvano mirror is used in the present embodiment. Movable mirror 74 has a reflection surface for reflecting measurement beams L1 and L2 that is configured capable of moving rotationally (rotating) around an axis line parallel to the X-axis. The angle of rotational movement of movable mirror 74 is controlled by main controller 30 (not illustrated in FIG. 3, see FIG. 6). The angle control of movable mirror 74 will be further described later. Incidentally, an optical member (e.g., a prism or the like) other than the galvano mirror may be used, as far as such an optical member can control the reflection angle of measurement beams L1 and L2.

The position (the angle of a reflection surface) of half mirror 76 is fixed, which is different from movable mirror 74. The optical paths of the parts of measurements beams L1 and L2 reflected off the reflection surface of movable mirror 74 are bent to the −Z direction by half mirror 76, and then the parts of measurements beams L1 and L2 are incident almost perpendicularly on grating mark GM formed on wafer W, via objective transparent plate 62. Note that, in FIG. 3, movable mirror 74 is inclined at a 45 degree angle with respect to the Z-axis, and the parts of measurement beams L1 and L2 from movable mirror 74 are reflected off half mirror 76 in a direction parallel to the Z-axis. Further, although only movable mirror 74 and half mirror 76 are disposed on the optical paths of measurement beams L1 and L2 between light source 72 and objective transparent plate 62 in FIG. 3, irradiation system 70 is configured so that measurement beams L1 and L2 emitted from objective transparent plate 62 are almost perpendicularly incident on grating mark GM formed on wafer W even in the case where movable mirror 74 is inclined at an angle other than a 45 degree angle with respect to the Z-axis.

In this case, on the optical paths of measurement beams L1 and L2 between light source 72 and objective transparent plate 62, at least one optical member that is different from movable mirror 74 and half mirror 76 may be disposed. Measurement beams L1 and L2 having passed (transmitted) through half mirror 76 are incident on beam position detection sensor 78 via a lens 77. Beam position detection sensor 78 has a photoelectric conversion element such as a PD (Photo Detector) array or a CCD (Charge Coupled Device), and its imaging plane is disposed on a plane conjugate with the wafer W surface.

Here, as illustrated in FIG. 2a, the distance between measurement beams L1 and L2 is set so that, of measurement beams L1 and L2 emitted from light source 72, measurement beam L1 is irradiated on the first grating mark GMa and measurement beam L2 is irradiated on the second grating mark GMb. In alignment system 50, when the angle of the reflection surface of movable mirror 74 is changed, the respective incidence (irradiation) positions of measurement beams L1 and L2 on grating marks GMa and GMb (wafer W) are changed in the scanning direction (the Y-axis direction, the first direction) in accordance with the angle of the reflection surface of movable mirror 74 (see outlined arrows in FIG. 2). Further, in conjunction with the positional change on grating mark GM of measurement beams L1 and L2, the incidence positions of measurement beams L1 and L2 on beam position detection sensor 78 (see FIG. 3) are also changed. The output of beam position detection sensor 78 is supplied to main controller 30 (not illustrated in FIG. 2, see FIG. 6). Main controller 30 can obtain irradiation position information of measurement beams L1 and L2 on wafer W on the basis of the output of beam position detection sensor 78.

Figure 4A:
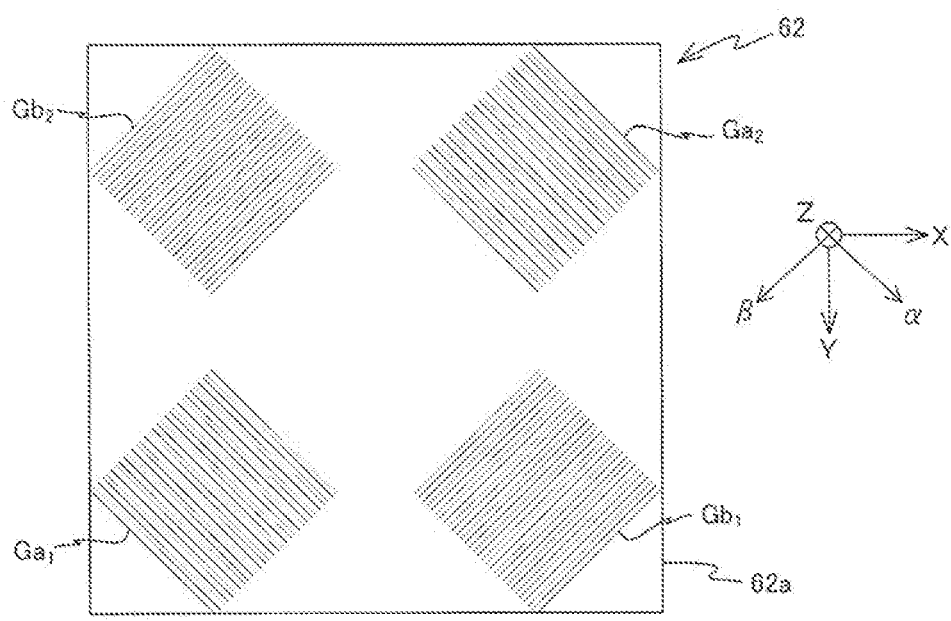
FIG. 4a is a plan view of an objective transparent plate that the alignment system in FIG. 3 has.

Objective optical system 60 is equipped with objective transparent plate 62, a detector-side transparent plate 64 and a grating plate 66. Objective transparent plate 62 is formed, into roughly a square shape in a planar view, of a transparent (light-transmissible) material, e.g., a quartz glass or the like, and objective transparent plate 62 includes a main section 62a disposed almost parallel to a horizontal plane and a plurality of transmission type diffraction gratings (hereinafter, simply referred to as "diffraction gratings") formed on the lower surface of the main section 62a. FIG. 4a shows a plan view of objective transparent plate 62 when viewed from the lower surface side (the −Z side).

On the lower surface of main section 62a, diffraction gratings (diffraction gratings $Ga_1$ and $Ga_2$) with a period direction in the β direction and diffraction gratings (diffraction gratings $Gb_1$ and $Gb_2$) with a period direction in the α direction are formed. A grating pitch of each of diffraction gratings $Ga_1$, $Ga_2$, $Gb_1$ and $Gb_2$ is set to the same value in design as the grating pitches (P1 and P2 described above) of grating mark GMa and GMb (see FIG. 2a for each of them). Diffraction gratings $Ga_1$ and $Ga_2$ are disposed apart from each other in the β direction and diffraction gratings $Gb_1$ and $Gb_2$ are disposed apart from each other in the α direction. Further, diffraction gratings $Ga_1$ to $Gb_2$ are each formed so as to avoid the center portion of main section 62a. As illustrated in FIG. 3, measurement beams L1 and L2 whose optical paths are bent to the −Z direction by half mirror 76 pass (are transmitted) through the center portion of main section 62a and are irradiated on grating mark GM. Of main section 62a of objective transparent plate 62, an area including the center portion described above (an area where diffraction gratings $Ga_1$, $Ga_2$, $Gb_1$ and $Gb_2$ are not formed) is referred to as a "transmissive area" or a "first area". Further, diffraction grating $Ga_1$ and/or diffraction grating $Gb_1$ are/is also referred to as (a) first optical component (S), and diffraction grating $Ga_2$ and/or diffraction grating $Gb_2$ are/is also referred to as (a) second optical component(s).

Figure 4B:
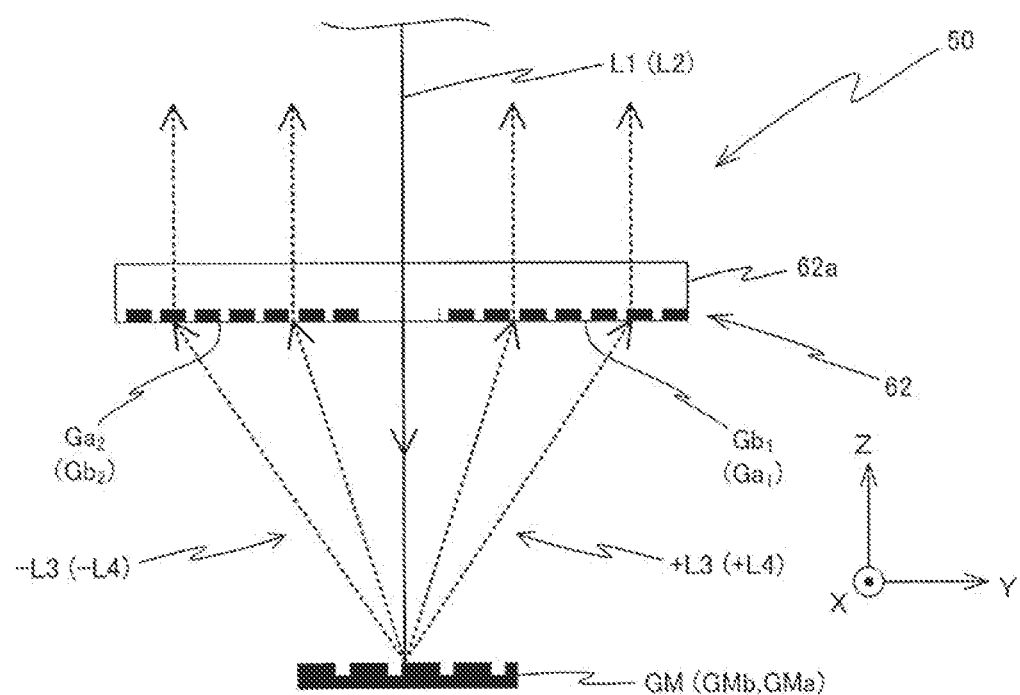
FIG. 4b is a view showing diffraction beams incident on the objective transparent plate.

In alignment system 50, as illustrated in FIG. 4b, in a state where grating mark GM (GMa and GMb) is located directly under the transmissive area in main section 62a, measurement beam L1 is irradiated on the first grating mark GMa via the transmissive area. Then, a plurality of +first-order diffraction beams (+L3), based on measurement beam L1, generated from the first grating mark GMa are incident on diffraction grating Ga$_1$, and a plurality of −first-order diffraction beams (−L3), based on measurement beam L1, generated from the first grating mark GMa are incident on diffraction grating Ga$_2$. Similarly, when measurement beam L2 is irradiated on the second grating mark GMb via the transmissive area, a plurality of +first-order diffraction beams (+L4), based on measurement beam L2, generated from the second grating mark GMb are incident on diffraction grating Gb$_1$, and a plurality of −first-order diffraction beams (−L4), based on measurement beam L2, generated from the second grating mark GMb are incident on diffraction grating Gb$_2$. Note that in the case where white light is used as measurement beams L1 and L2 as in the present embodiment, a plurality of −first-order diffraction beams and a plurality of +first-order diffraction beams, according to beams with a plurality of wavelengths included in the white light, are to be generated.

The +first-order diffraction beams (+L3 and +L4) are diffracted by diffraction gratings Ga$_1$ and Gb$_1$, respectively, and the −first-order diffraction beams (−L3 and −L4) are diffracted by diffraction gratings Ga$_2$ and Gb$_2$, respectively. At this time, a predetermined-order diffraction beams, of measurement beams L1 and L2, generated by the setting of the grating pitch of each of grating marks GMa and GMb and diffraction gratings Ga$_1$, Ga$_2$, Gb$_1$ and Gb$_2$ corresponding to these grating marks, which are the respective −first-order diffraction beams of the +first-order diffraction beams (+L3 and +L4) and the respective +first-order diffraction beams of the −first-order diffraction beams (−L3 and −L4), travel parallel to an optical axis of objective optical system 60 (see FIG. 3) (parallel to the Z-axis direction) toward beam receiving system 80 (see FIG. 3). Further, the respective zero-order diffraction beams from grating marks GMa and GMb of measurement beams L1 and L2 are to be attenuated because any diffraction gratings are not formed in the center portion of objective transparent plate 62 (i.e., the surface state of the transmissive area and the surface state of an area where diffraction gratings Ga$_1$ to Gb$_2$ are formed are optically different). Although it is preferable in this case that the respective zero-order diffraction beams from grating marks GMa and GMb of measurement beams L1 and L2 are intercept (impeded) from travelling to beam receiving system 80 (see FIG. 3), these zero-order diffraction beams may be attenuated at least in a range to prevent them from becoming measurement noise in beam receiving system 80.

The respective predetermined-order diffraction beams described previously of the +first-order diffraction beams (±L3 and ±L4) emitted from objective transparent plate 62 (hereinafter, also referred to, collectively, as the diffraction beams from objective transparent plate 62) are incident on detector-side transparent plate 64 disposed above objective transparent plate 62, as illustrated in FIG. 3.

Since the configuration and the functions of detector-side transparent plate 64 are substantially the same as those of objective transparent plate 62, the description thereof will be omitted. That is, the diffraction beams from objective transparent plate 62 that are incident on detector-side transparent plate 64 are incident on transmission type diffraction gratings formed on the lower surface of a main section 64a of detector-side transparent plate 64, and thereby diffracted (their optical paths are bent), and are incident on grating plate 66 disposed above detector-side transparent plate 64.

Figure 5A:
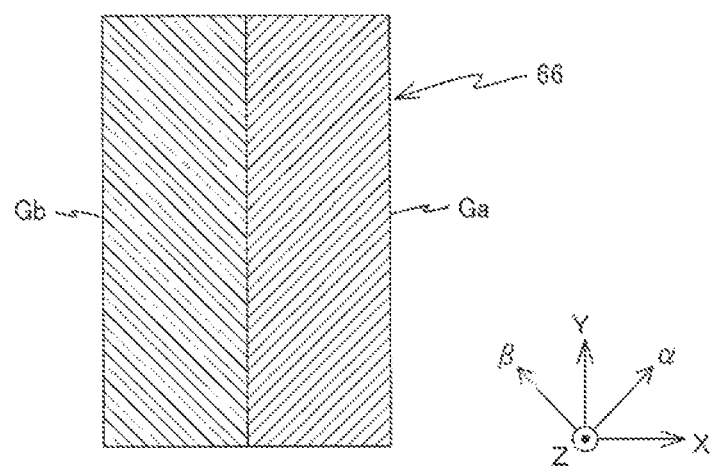
FIG. 5a is a plan view of a grating plate for detection that the alignment system in FIG. 3 has.

Grating plate 66 is made up of a plate-shaped member extending parallel to the Y-axis direction that is disposed parallel to detector-side transparent plate 64. As illustrated in FIG. 5a, readout diffraction gratings Ga and Gb are formed on grating plate 66. Readout diffraction grating Ga is a transmission type diffraction grating with a period direction in the β direction that corresponds to grating mark GMa (see FIG. 2a). Readout diffraction grating Gb is a transmission type diffraction grating with a period direction in the α direction that corresponds to grating mark GMb (see FIG. 2a).

When performing position measurement of grating mark GM using alignment system 50, main controller 30 (see FIG. 6) controls movable mirror 74 of alignment system 50 while driving grating mark GM (i.e., wafer W) in the Y-axis direction (the first direction) relative to objective transparent plate 62 (i.e., alignment system 50) as shown by a double-headed arrow in FIG. 3, and thereby causes measurement beams L1 and L2 to follow grating mark GM and scans measurement beams L1 and L2 in the Y-axis direction (the first direction). Accordingly, since grating mark GM and grating plate 66 are relatively moved in the Y-axis direction, interference fringes are imaged (formed) on readout diffraction gratings Ga and Gb (see FIG. 5a), by interference between the diffraction beams deriving from the diffraction beams (±L3 and ±L4) based on measurement beams L1 and L2.

Beam receiving system 80 is equipped with: a detector 84; an optical system 86 that guides, to detector 84, light corresponding to images (interference fringes) formed on grating plate 66; and the like.

The light corresponding to the images (the interference fringes) formed on readout diffraction gratings Ga and Gb is guided to detector 84 via a mirror 86a that optical system 86 has. In alignment system 50 of the present embodiment, optical system 86 has a spectral prism 86b, corresponding to white light being used as measurement beams L1 and L2. The light from grating plate 66 is spectrally split, for example, into respective colors of light, i.e., blue light, green light and red light, via spectral prism 86b. Detector 84 has photodetectors PD1 to PD3 that are independently provided corresponding to the respective colors described above. The output of each of photodetectors PD1 to PD3 that detector 84 has is supplied to main controller 30 (not illustrated in FIG. 3, see FIG. 6).

Figure 5B:
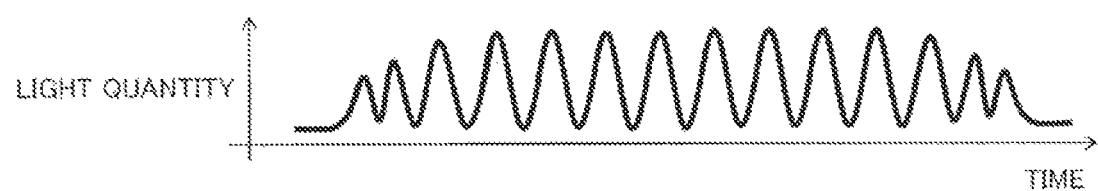
FIG. 5b is a view showing an example of a signal obtained from a beam receiving system that the alignment system in FIG. 3 has.
Figure 6:
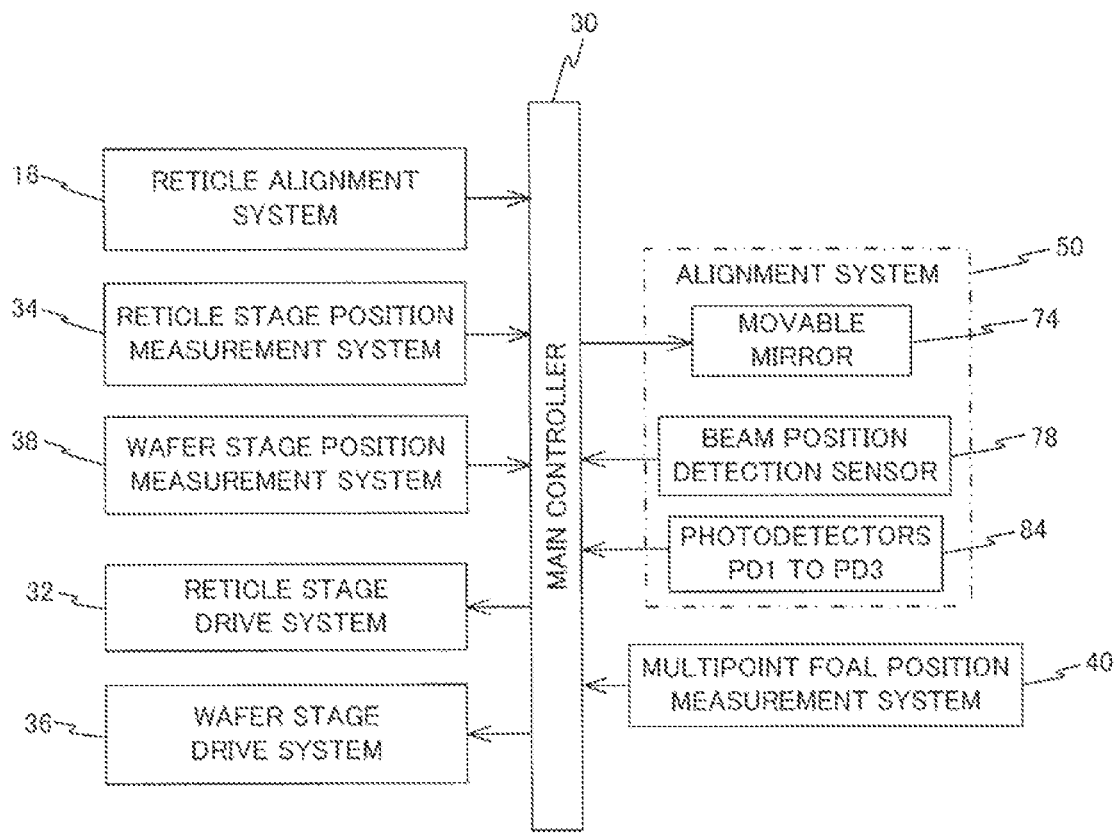
FIG. 6 is a block diagram showing a control system of the exposure apparatus.

From the output of each of photodetectors PD1 to PD3, a signal (an interference signal) having a waveform as illustrated in FIG. 5b is obtained, as an example. Main controller 30 (see FIG. 6) obtains the position of each of grating marks GMa and GMb, by calculation, from the phase of the signal described above. That is, in exposure apparatus 10 (see FIG. 1) of the present embodiment, alignment system 50 and main controller 30 (see FIG. 6 for each of them) configure an alignment device for obtaining positional information of grating mark GM formed on wafer W. Note that the signal as illustrated in FIG. 5b is generated on the basis of the relative position between grating marks GMa and GMb, and readout diffraction gratings Ga and Gb. Incidentally, the driving of grating marks GMa and GMb in the Y-axis direction and the scanning of measurement beams L1 and L2 in the Y-axis direction do not necessarily have to be completely in synchronization (their velocities do not strictly have to be coincident).

In exposure apparatus 10 (see FIG. 1) configured as described above, first of all, reticle R and wafer W are loaded onto reticle stage 14 and wafer stage 22, respectively, and predetermined preparatory works such as reticle alignment using reticle alignment system 18 and wafer alignment (e.g., EGA (Enhanced Global Alignment) or the like) using alignment system 50 are performed. Incidentally, the preparatory works such as the reticle alignment referred to above and baseline measurement are disclosed in detail in, for example, U.S. Pat. No. 5,646,413, U.S. Patent Application Publication No. 2002/0041377 and the like. Further, the EGA following the reticle alignment and the baseline measurement is disclosed in detail in, for example, U.S. Pat. No. 4,780,617 and the like.

Here, in the present embodiment, main controller 30 obtains surface position information of wafer W using AF system 40, prior to a position measurement operation of grating mark GM using alignment system 50. Then, main controller 30 controls the position and the attitude in the Z-axis direction (the tilt in the θx direction and the θz direction) of wafer table 26 on the basis of the surface position information described above and the offset value that has been obtained beforehand for each layer, and thereby causes objective optical system 60 of alignment system 50 to focus on grating mark GM. Note that, in the present embodiment, the offset value refers to the measurement value of AF system 40 that is obtained when the position and the attitude of wafer table 26 are adjusted so that the signal intensity (the contrast of the interference fringes) of alignment system 50 is maximized. In this manner, in the present embodiment, the position and the attitude of wafer table 26 are controlled in almost real time, by using the surface position information of wafer W obtained immediately before the detection of grating mark GM by alignment system 50. Incidentally, the surface position detection of wafer W may be performed by receiving the light from grating mark GM subject to position measurement, concurrently with the position measurement of grating mark GM.

After that, under the control of main controller 30, wafer stage 22 is moved to an acceleration starting position for exposure with respect to the first shot area on wafer W, and reticle stage 14 is moved so that reticle R is positioned at an acceleration starting position. Then, reticle stage 14 and wafer stage 22 are driven in synchronization along the Y-axis direction, and thereby exposure with respect to the first shot area on wafer W is performed. Afterwards, exposure of wafer W is completed by performing exposure with respect to all the shot areas on wafer W.

With alignment system 50 equipped in exposure apparatus 10 related to the present first embodiment described so far, the travelling directions of the beams diffracted from grating mark GM (GMa and GMb) with a specific pitch (P1 and P2) are changed using objective transparent plate 62 on which diffraction gratings $Ga_1$ to $Gb_2$ are formed (utilizing the diffraction phenomenon of the beams), while a typical lens changes the travelling directions of beams utilizing the refraction phenomenon of the beams, and therefore, the increase in size of objective optical system 60 as a whole can be suppressed, compared with the case of using a lens as an objective optical element.

Further, alignment system 50 related to the present embodiment scans measurement beams L1 and L2 with respect to grating mark GM ((GMa and GMb), see FIG. 2*a*) in the Y-axis direction while moving wafer W (wafer stage 22) in the Y-axis direction as illustrated in FIG. 3, and therefore, a position measurement operation of the grating mark GM can be performed concurrently with, for example, a movement operation of wafer stage 22 toward an exposure starting position that is performed after wafer W is loaded onto wafer stage 22. In this case, it is preferable to dispose alignment system 50 beforehand on the movement course of wafer stage 22. With this disposition in advance, the alignment measurement time can be shortened and the overall throughput can be improved.

Further, alignment system 50 related to the present embodiment scans the measurement beams so as to follow wafer W (grating mark GM) that is moved in the scanning direction, which allows for the measurement for a long period of time. Therefore, since the so-called moving average of the output can be taken, the influence of the vibration of the apparatus can be reduced. Further, if a mark in a line-and-space shape is detected using an image sensor (such as a CCD) as a beam receiving system of the alignment system, the other images than the images of lines completely parallel to the scanning direction cannot be detected (such images are distorted), when the measurement beams are scanned to follow wafer W that is moved in the scanning direction. In contrast, in the present embodiment, since the position measurement of grating mark GM is performed by causing the diffraction beams from the grating mark GM to interfere with each other, the mark detection can be reliably performed.

Further, alignment system 50 related to the present embodiment has, for example, three photodetectors PD1 to PD3 (for blue light, green light and red light, respectively) as detector 84, corresponding to measurement beams L1 and L2 that are white light. Therefore, for example, by detecting overlay marks (not illustrated) formed on wafer W using the white light, and obtaining the color of the light with which the contrast of the interference fringes is the highest beforehand prior to wafer alignment, which output of the three photodetectors PD1 to PD3 exemplified above is optimal to be used in the wafer alignment can be determined.

Second Embodiment

Next, an exposure apparatus related to a second embodiment will be discussed. Since the exposure apparatus related to the present second embodiment is different only in the configuration of a part of an alignment system, from exposure apparatus 10 related to the first embodiment described previously, only the difference will be described below, and with regard to components that have the same configurations and functions as those in the first embodiment, the same reference signs as those in the first embodiment will be used and the description thereof will be omitted.

Figure 7A:
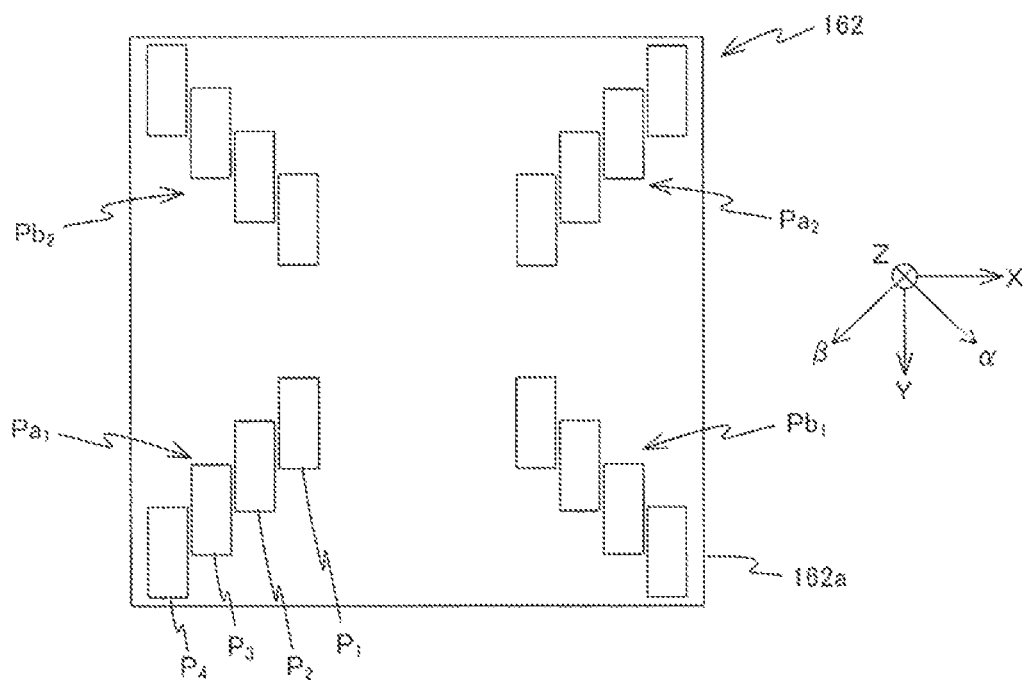
FIG. 7a is a plan view of an objective transparent plate that an alignment system related to a second embodiment has.

FIG. 7*a* shows a plan view of an objective transparent plate (also referred to as an objective optical element) 162, when viewed from below (the −Z side), that an alignment system (the entire figure is not illustrated) related to the present second embodiment has. Note that the alignment system related to the present second embodiment has an irradiation system and a beam receiving system that are similar to those of the first embodiment, though they are not illustrated.

Figure 7B:
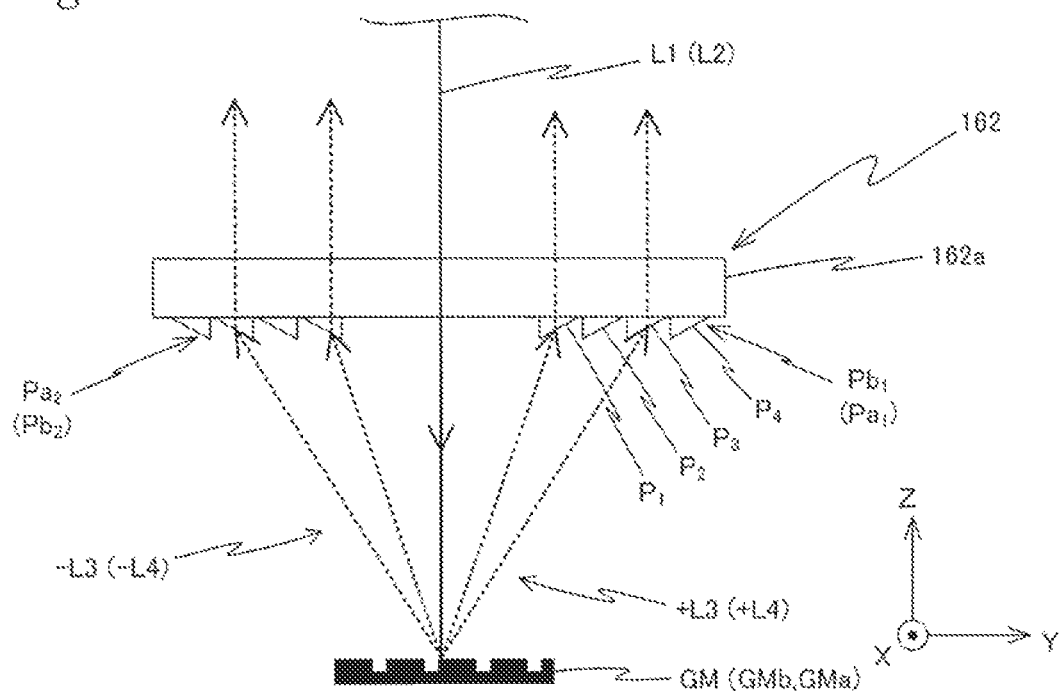

In the first embodiment described previously (see FIG. 3), the diffraction beams (±L3 and ±L4) from grating marks GMa and GMb (see FIG. 2*a* for each of them) based on measurement beam L1 and measurement beam L2 are diffracted toward beam receiving system 80, by diffraction gratings $Ga_1$ to $Gb_2$ formed on main section 62*a* of objective transparent plate 62 (see FIG. 4*b*), while in the present second embodiment, as illustrated in FIG. 7*b*, the diffraction beams (±L3 and ±L4) from grating marks GMa and GMb based on measurement beams L1 and L2 are deflected in parallel to the Z-axis toward beam receiving system 80, by a plurality of, e.g., four prisms groups $Pa_1$, $Pa_2$, $Pb_1$ and $Pb_2$ formed on the lower surface of a main section 162*a* of objective transparent plate 162, which is the difference between the first embodiment and the second embodiment. Note that white light is used as measurement beams L1 and L2 (see FIG. 3) in the first embodiment, while a plurality of beams with different wavelengths from each other are used as measurement beams L1 and L2 in the present second embodiment. Note that the plurality of beams with different wavelengths referred to above are illustrated as one beam for the sake of convenience in FIG. 7b.

Here, since the configurations of the four prism groups $Pa_1$ to $Pb_2$ are substantially the same except that the disposed positions are different, prism group $Pa_1$ will be described below. Prism group $Pa_1$ has a plurality of, e.g., four prisms $P_1$ to $P_4$. Here, the four prisms $P_1$ to $P_4$ are right-angle prisms with a triangle-shaped X-Z cross section having the same length in the Y-axis direction, and are integrally fixed to the lower surface of main section 162a (or integrally formed with main section 162a). Further, the four prisms $P_1$ to $P_4$ are arrayed so that their centers are located at a predetermined interval on a diagonal line in the β direction. That is, the positions of the four prisms $P_1$ to $P_4$ in the Y-axis direction are different from each other.

As illustrated in FIG. 7b, the positions on main section 162a and the refraction indices of prisms $P_1$ to $P_4$ are each set, so that each of a plurality of diffraction beams from grating mark GMa based on measurement beam L1 is deflected in parallel to the Z-axis (i.e., in accordance with the wavelength of each of the plurality of beams included in measurement beam L1). Prism group $Pb_1$ is disposed laterally symmetric with respect to prism group $Pa_1$ in FIG. 7a, prism group $Pa_2$ is disposed vertically symmetric with respect to prism group $Pb_1$ in FIG. 7a, and prism group $Pb_2$ is disposed laterally symmetric with respect to prism group $Pa_2$ in FIG. 7a. Consequently, as illustrated in FIG. 7b, when measurement beams L1 and L2 are irradiated on grating mark GM via a transmissive area formed in the center portion of main section 162a, the optical paths of the ±first-order diffraction beams ±L3 and ±L4 from grating mark GM based on measurement beams L1 and L2 are bent, by the corresponding prisms $Pa_1$ to $Pb_2$, in almost parallel to the Z-axis toward beam receiving system 80 (not illustrated in FIG. 7b, see FIG. 3), in the similar manner to the first embodiment described previously.

Also in the present second embodiment, the effect of suppressing the increase in size of the objective optical system of the alignment system can be obtained, in a similar manner to the first embodiment.

Figure 2B:
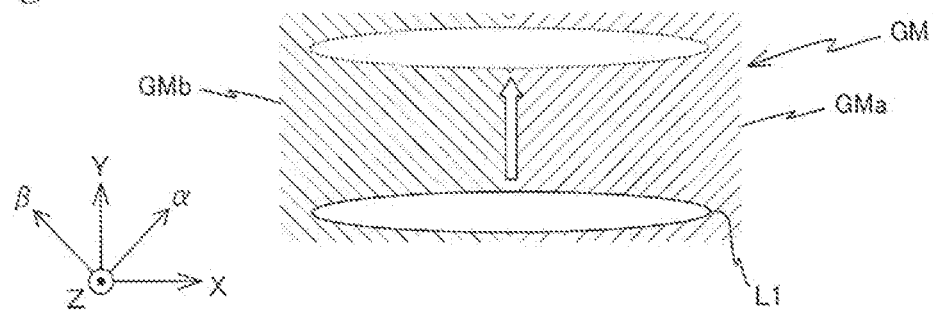

Note that the alignment systems, and the detection systems of the grating marks including the alignment systems and the detection methods thereof related to the first embodiment and the second embodiment described above can be changed as needed. For example, in the first embodiment and the second embodiment described above, as illustrated in FIG. 2a, grating marks GMa and GMb are irradiated with measurement beams L1 and L2 that correspond to grating marks GMa and GMb, respectively. However, the measurement beams are not limited thereto, and as illustrated in FIG. 2b, a single measurement beam L1 elongated (wide) in the X-axis direction may be irradiated on grating marks GMa and GMb.

Figure 2C:
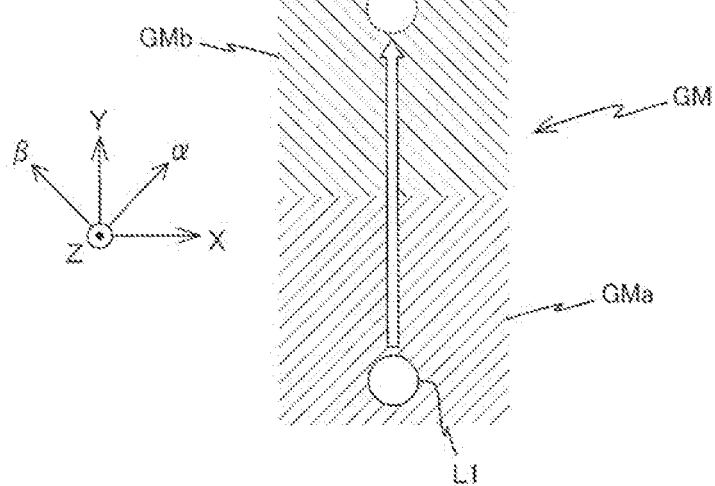

Further, in the first embodiment and the second embodiment described above, as illustrated in FIG. 2a, grating marks GMa and GMb are arrayed along the X-axis direction. However, the arrayed direction is not limited thereto, and as illustrated in FIG. 2c, grating marks GMa and GMb may be arrayed along the Y-axis direction. In this case, the position in the X-Y plane of grating mark GM can be obtained by scanning a single measurement beam L1 in the order of grating marks GMa and GMb (or the reversed order).

Figure 8A:
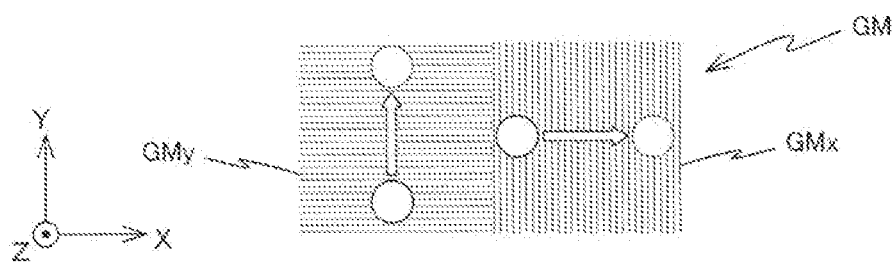
FIG. 8a is a view showing a modified example of a grating mark.
Figure 8B:
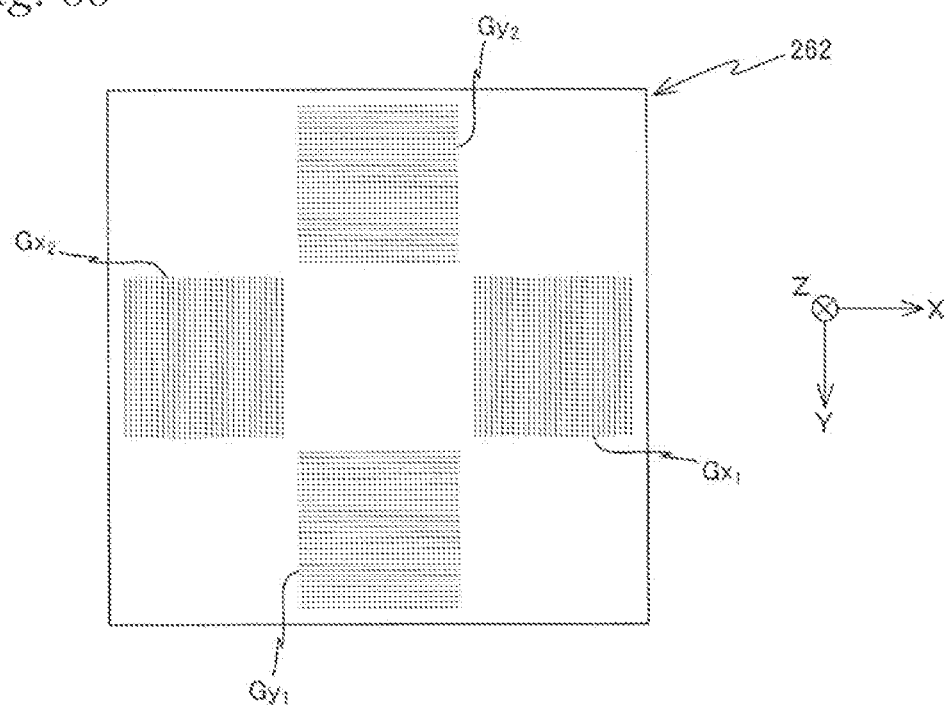

Further, in grating marks GMa and GMb in the first embodiment and the second embodiment described above, the grating lines are at a 45 degree angle with respect to the X-axis and the Y-axis. However, the grating marks are not limited thereto, and for example, a grating mark GMy with a period direction in the Y-axis direction and a grating mark GMx with a period direction in the X-axis direction as illustrated in FIG. 8a may be used. In this case, an objective transparent plate (objective optical element) 262 equipped with diffraction gratings $Gx_1$, $Gx_2$, $Gy_1$ and $Gy_2$ corresponding to grating mark GMx and grating mark GMy as illustrated in FIG. 8b are used, and thereby an alignment system whose size is suppressed from increasing while the wide detection field of view is secured can be realized in a similar manner to the first embodiment and the second embodiment described above. Note that in the case of detecting grating mark GMx as illustrated in FIG. 8a using the alignment system including objective transparent plate 262 as illustrated in FIG. 8b, it is preferable that the measurement beams are scanned in the X-axis direction or the Y-axis direction as needed, for example, using a two-axes galvano mirror.

Further, objective transparent plate 62 as illustrated in FIG. 4a may be configured rotatable around the Z-axis by, for example, 45 degrees. In this case, diffraction gratings $Ga_1$ to $Gb_2$ that are formed on objective transparent plate 62 after such a rotation each have a period direction in the X-axis direction or the Y-axis direction, and therefore, objective transparent plate 62 functions in a similar manner to objective transparent plate 262 as illustrated in FIG. 8b. Consequently, detection of grating marks GM as illustrated in FIGS. 2a to 2c, respectively, and detection of grating mark GM as illustrated in FIG. 8a can be performed.

Further, objective optical system 60 equipped in the alignment system in the first embodiment and the second embodiment described above has detector-side transparent plate 64 that has substantially the same configuration as objective transparent plate 62 (or objective transparent plate 162 in the second embodiment). However, an optical system on the detector side is not limited thereto, but may be a lens similar to that of a conventional optical system.

Figure 9:
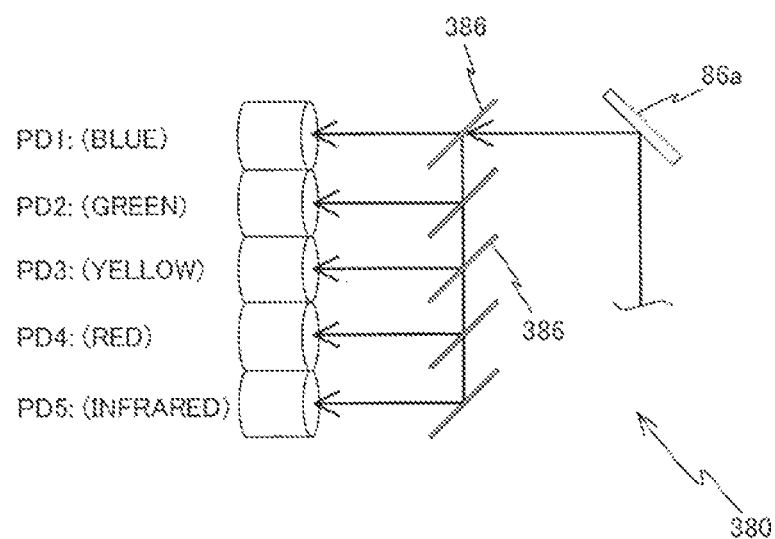
FIG. 9 is a view showing a modified example of a beam receiving system of an alignment system.

Further, beam receiving system 80 of alignment system 50 in the first embodiment described above spectrally splits white light with spectral prism 86b. However, the spectral means is not limited thereto, and like a beam receiving system 380 as illustrated in FIG. 9, white light may be spectrally split toward photodetectors PD1 to PD5 disposed corresponding to the respective colors of light (e.g., blue light, green light, yellow light, red light and infrared light) by using a plurality of spectral filters 386.

Further, in the first embodiment described above, white light is used as measurement beams L1 and L2. However, the measurement beams are not limited to white light, and a plurality of beams with wavelengths different from each other may be used, in a similar manner to the second embodiment described above. Further, although a plurality of beams with wavelengths different from each other are used as measurement beams L1 and L2 in the second embodiment described above, white light may be used as measurement beams L1 and L2 in a similar manner to the first embodiment described above.

Figure 10:
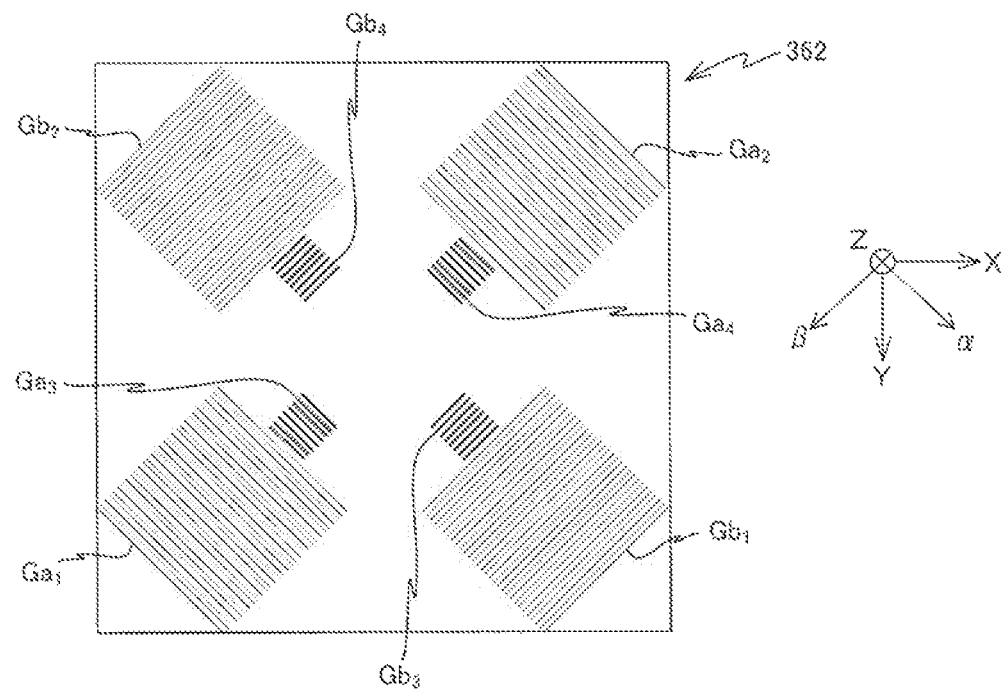
FIG. 10 is a plan view of an objective transparent plate related to a modified example.

In the first embodiment and the second embodiment described above, alignment system 50 is used to detect the grating marks for performing the alignment (the fine alignment) between the reticle pattern and the wafer. However, the marks to be detected with the alignment system are not limited thereto, and, for example, the alignment system may be used to detect search marks formed on wafer W (grating marks with thicker linewidths and rougher pitches than grating marks GMa and GMb), immediately after wafer W is loaded onto wafer stage 22. In this case, as in an objective transparent plate (which is also referred to as an objective optical element) 362 as illustrated in FIG. 10, it is preferable that diffraction gratings $Ga_3$ and $Ga_4$ with period directions in the β direction and diffraction gratings $Gb_3$ and $Gb_4$ with period directions in the α direction, according to the search marks, are additionally formed avoiding a transmissive area.

Further, the disposed position and the number of alignment system 50 can be changed as needed, and for example, a plurality of alignment systems 50 may be disposed at a predetermined interval in the X-axis direction. In this case, grating marks formed in a plurality of shot areas whose positions in the X-axis direction are different can be detected simultaneously. Further, in this case, a part of the plurality of alignment systems 50 may be configured movable with fine strokes in the X-axis direction. In this case, a plurality of grating marks formed on a wafer can be detected even if the shot map is different.

Further, in the first embodiment described above, the grating pitches of diffraction gratings $Ga_1$ to $Gb_2$ formed on objective transparent plate 62 equipped in alignment system 50 are set the same as the grating pitches of grating marks GMa and GMb subject to detection. However, the grating pitches of diffraction gratings $Ga_1$ to $Gb_2$ are not limited thereto, but for example, may be 1/n (n is a natural number) of the grating pitches of grating marks GMa and GMb.

Further, objective transparent plate 162 in the second embodiment described above has a plurality of prism groups $Pa_1$ to $Pb_2$ in order to bend the optical paths of diffractions beams ±L3 and ±L4 from grating mark GM. However, the optical components for bending the optical paths are not limited thereto, but may be, for example, mirrors or the like.

Further, the respective configurations described in detail in the first embodiment and the second embodiment described above, respectively, may be arbitrarily combined to be implemented.

Further, illumination light IL is not limited to the ArF excimer laser beam (with a wavelength of 193 nm), but may be ultraviolet light such as a KrF excimer laser beam (with a wavelength of 248 nm), or vacuum ultraviolet light such as an $F_2$ laser beam (with a wavelength of 157 nm). For example, as is disclosed in U.S. Pat. No. 7,023,610, a harmonic wave, which is obtained by amplifying a single-wavelength laser beam in the infrared or visible range emitted by a DFB semiconductor laser or a fiber laser as vacuum ultraviolet light, with a fiber amplifier doped with, for example, erbium (or both erbium and ytterbium), and by converting the wavelength into ultraviolet light using a nonlinear optical crystal, may also be used. Further, the wavelength of illumination light IL is not limited to the light having a wavelength equal to or more than 100 nm, and the light having a wavelength less than 100 nm may be used, and for example, the embodiments described above can also be applied to an EUV (Extreme Ultraviolet) exposure apparatus that uses an EUV light in a soft X-ray range (e.g., a wavelength range from 5 to 15 nm). In addition, the embodiments described above can also be applied to an exposure apparatus that uses charged particle beams such as an electron beam or an ion beam.

Further, the projection optical system in the exposure apparatus of each of the embodiments described above is not limited to a reduction system but may be either of an equal magnifying system or a magnifying system, and projection optical system 16b is not limited to a dioptric system but may be either of a catoptric system or a catadioptric system, and its projected image may be either of an inverted image or an erected image.

Further, in each of the embodiments described above, a light-transmission type mask (reticle), which is a light-transmissive substrate on which a predetermined light shielding pattern (or a phase pattern or a light attenuation pattern) is formed, is used. Instead of this reticle, however, as is disclosed in, for example, U.S. Pat. No. 6,778,257, an electron mask (which is also called a variable shaped mask, an active mask or an image generator, and includes, for example, a DMD (Digital Micro-mirror Device) that is a type of a non-emission type image display device (spatial light modulator) or the like) on which a light-transmitting pattern, a reflection pattern, or an emission pattern is formed on the basis of electronic data of the pattern that is to be exposed may also be used.

Further, each of the embodiments described above can also be applied to an exposure apparatus that performs an exposure operation in a state in which a space between a projection optical system and an object to be exposed (e.g., a wafer) is filled with a liquid (e.g., pure water), which is a so-called liquid immersion exposure apparatus, as is disclosed in, for example, U.S. Pat. No. 8,004,650.

Further, each of the embodiments described above can also be applied to an exposure apparatus that is equipped with two wafer stages, as is disclosed in, for example, U.S. Patent Application Publication No. 2010/0066992.

Further, each of the embodiments described above can also be applied to an exposure apparatus (lithography system) that forms line-and-space patterns on wafer W by forming interference fringes on wafer W, as is disclosed in, for example, PCT International Publication No. 01/35168. Further, each of the embodiments described above can also be applied to a reduction projection exposure apparatus by a step-and-stitch method that synthesizes a shot area and a shot area.

Further, each of the embodiments described above can also be applied to an exposure apparatus that synthesizes two reticle patterns on a wafer via a projection optical system and almost simultaneously performs double exposure of one shot area on the wafer by one-time scanning exposure, as is disclosed in, for example, U.S. Pat. No. 6,611,316.

Further, an object on which a pattern is to be formed (an object to be exposed to which an energy beam is irradiated) in each of the embodiments described above is not limited to a wafer, but may be other objects such as a glass plate, a ceramic substrate, a film member, or a mask blank.

Further, the use of the exposure apparatus is not limited to the exposure apparatus used for manufacturing semiconductor devices, and can be widely applied also to, for example, an exposure apparatus for manufacturing liquid crystal display devices which transfers a liquid crystal display device pattern onto a square-shaped glass plate, and to an exposure apparatus for manufacturing organic EL, thin-film magnetic heads, imaging devices (such as CCDs), micromachines, DNA chips or the like. Further, each of the embodiments described above can also be applied to an exposure apparatus that transfers a circuit pattern onto a glass substrate or a silicon wafer or the like, not only when producing microdevices such as semiconductor devices, but also when producing a reticle or a mask used in an exposure apparatus such as an optical exposure apparatus, an EUV exposure apparatus, an X-ray exposure apparatus, or an electron beam exposure apparatus.

Electronic devices such as semiconductor devices are manufactured through the steps such as: a step in which the function/performance design of a device is performed; a step in which a reticle based on the design step is manufactured; a step in which a wafer is manufactured using a silicon material; a lithography step in which a pattern of a mask (the reticle) is transferred onto the wafer with the exposure apparatus (a pattern forming apparatus) of the embodiments described previously and the exposure method thereof; a development step in which the wafer that has been exposed is developed; an etching step in which an exposed member of the other section than a section where resist remains is removed by etching; a resist removal step in which the resist that is no longer necessary when etching is completed is removed; a device assembly step (including a dicing process, a bonding process, and a packaging process); and an inspection step. In this case, in the lithography step, the exposure method described previously is implemented using the exposure apparatus of the embodiments described above and a device pattern is formed on the wafer, and therefore, the devices with a high integration degree can be manufactured with high productivity.

Incidentally, the disclosures of all the publications, the PCT International Publications, the U.S. patent application Publications and the U.S. patents related to exposure apparatuses and the like that are cited in the description so far are each incorporated herein by reference.

While the above-described embodiments of the present invention are the presently preferred embodiments thereof, those skilled in the art of lithography systems will readily recognize that numerous additions, modifications, and substitutions may be made to the above-described embodiments without departing from the spirit and scope thereof. It is intended that all such modifications, additions, and substitutions fall within the scope of the present invention, which is best defined by the claims appended below.

What is claimed is:

1. A measurement system that measures an object that moves toward an exposure area at which an energy beam is applied to the object, the measurement system comprising:
   a mark detection device that has an irradiation system configured to irradiate a mark provided at the object with a measurement beam while the object is moving in a first axis direction and while moving the measurement beam in the first axis direction, the first axis direction intersecting an axis of the energy beam; and
   a beam receiving system configured to receive a beam from the mark, wherein
   the irradiation system irradiates the object with the measurement beam while moving the measurement beam in the first axis direction, during a period when the object moves in the first axis direction toward the exposure area.

2. The measurement system according to claim 1, further comprising
   a first movement device that moves the object in the first axis direction.

3. The measurement system according to claim 1, further comprising
   a position measurement device that acquires position information on a surface of the object in a second axis direction intersecting the surface of the object, wherein the mark is provided on the surface of the object.

4. The measurement system according to claim 3, further comprising
   a second movement device that moves the object in the second axis direction, based on the position information on the surface of the object in the second axis direction acquired by the position measurement device, wherein
   movement of the object by the second movement device is performed prior to detection of the mark by the mark detection device and the beam receiving system.

5. The measurement system according to claim 3, wherein acquisition of the position information by the position measurement device is performed prior to detection of the mark by the mark detection device and the beam receiving system.

6. The measurement system according to claim 3, wherein
   a distance in the first axis direction between the object and the exposure area at a time of detection of the mark by the mark detection device and the beam receiving system is shorter than a distance in the first axis direction between the object and the exposure area at a time of acquisition of the position information by the position measurement device.

7. The measurement system according to claim 1, further comprising
   an objective optical system, wherein
   the mark is a diffraction mark, and
   the beam receiving system receives a diffraction beam, via the objective optical system, from the diffraction mark of the object facing the objective optical system.

8. The measurement system according to claim 7, wherein the objective optical system includes an objective optical element, and
   the objective optical element has a first area in which an optical path of the measurement beam from the irradiation system is provided, and a second area in which an optical component is provided, the optical component deflecting or diffracting the diffraction beam generated at the diffraction mark toward the beam receiving system.

9. The measurement system according to claim 7, wherein the objective optical system includes an objective optical element, and
   the objective optical element deflects or diffracts a beam other than a zero-order beam of the diffraction beam toward the beam receiving system.

10. The measurement system according to claim 1, further comprising
    a mark position acquiring device that acquires position information of the mark based on a detection result of the mark detection device; and
    an object position controlling device that controls a position of the object based on the position information of the mark acquired by the mark position acquiring device.

11. An exposure apparatus comprising:
    the measurement system according to claim 10; and
    a pattern formation device that forms a predetermined pattern on the object by irradiating the object with the energy beam at the exposure area.

12. A measurement method of measuring an object that moves toward an exposure area at which an energy beam is applied to the object, the measurement method comprising:
    irradiating a mark provided at the object with a measurement beam while the object is moving in a first axis direction and while moving the measurement beam in the first axis direction, the first axis direction intersecting an axis of the energy beam; and
receiving a beam from the mark, wherein
the measurement beam is irradiated on the object while the measurement beam is being moved in the first axis direction, during a period when the object moves in the first axis direction toward the exposure area.

\* \* \* \* \*